United States Patent
Bauer et al.

(10) Patent No.: US 8,384,496 B2
(45) Date of Patent: Feb. 26, 2013

(54) MULTIBAND FILTER

(75) Inventors: Thomas Bauer, Munich (DE); Andreas Przadka, Munich (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/625,007

(22) Filed: Nov. 24, 2009

(65) Prior Publication Data
US 2010/0127795 A1  May 27, 2010

Related U.S. Application Data

(63) Continuation of application No. PCT/EP2008/056510, filed on May 27, 2008.

(30) Foreign Application Priority Data

May 29, 2007 (DE) .................. 10 2007 024 895

(51) Int. Cl.
*H03H 9/46* (2006.01)
*H04W 4/00* (2009.01)

(52) U.S. Cl. ............... 333/176; 455/422.1; 333/193

(58) Field of Classification Search ........ 455/422, 455/1; 333/165–167, 175, 176, 185, 202, 333/204, 205
See application file for complete search history.

(56) References Cited

U.S. PATENT DOCUMENTS

| | | | |
|---|---|---|---|
| 4,126,837 A | 11/1978 | Koyamada et al. | |
| 4,803,449 A | 2/1989 | Hikita et al. | |
| 5,184,096 A | 2/1993 | Wakino et al. | |
| 5,421,030 A * | 5/1995 | Baran | 725/106 |
| 5,815,052 A | 9/1998 | Nakajima et al. | |
| 6,043,725 A | 3/2000 | Taguchi et al. | |
| 6,107,898 A | 8/2000 | Rauscher | |
| 6,115,592 A | 9/2000 | Ueda et al. | |
| 6,147,571 A | 11/2000 | Kitazawa et al. | |
| 6,404,302 B1 * | 6/2002 | Satoh et al. | 333/193 |
| 6,606,016 B2 | 8/2003 | Takamine | |
| 6,737,935 B1 | 5/2004 | Shafer | |
| 6,765,458 B2 * | 7/2004 | Yamaguchi | 333/175 |
| 6,891,449 B2 * | 5/2005 | Takayama et al. | 333/133 |
| 6,927,648 B2 | 8/2005 | Furuya et al. | |
| 7,592,883 B2 * | 9/2009 | Shafer | 333/176 |
| 2006/0066419 A1 * | 3/2006 | Iwaki et al. | 333/133 |
| 2007/0296521 A1 * | 12/2007 | Schmidhammer | 333/133 |
| 2008/0186106 A1 | 8/2008 | Christian et al. | |

FOREIGN PATENT DOCUMENTS

| | | |
|---|---|---|
| DE | 10 2004 045 179 A1 | 3/2006 |
| DE | 10 2005 020 086 A1 | 11/2006 |
| EP | 0 747 988 B1 | 2/2002 |

(Continued)

OTHER PUBLICATIONS

Boyle, K. R., et al., "Nine-band Antenna System for Mobile Phones", Electronic Letters, Mar. 2, 2006, pp. 265-266, vol. 42, No. 5.

*Primary Examiner* — Robert Pascal
*Assistant Examiner* — Gerald Stevens
(74) *Attorney, Agent, or Firm* — Slater & Matsil, L.L.P.

(57) ABSTRACT

A band-stop filter is proposed which is constructed on a multilayered substrate and consists of a parallel circuit comprising a bandpass filter and a high-pass filter. The two filters are at least partly realized in the form of LC-elements integrated into the substrate. Further circuit components can be arranged as discrete components on the substrate. In the filter branch having the bandpass filter, an electroacoustic resonator is arranged in a transverse branch to ground. By means of the filter, a wide stop band is obtained, while the passband or passbands can comprise a plurality of radio bands.

17 Claims, 4 Drawing Sheets

FOREIGN PATENT DOCUMENTS

| | | |
|---|---|---|
| EP | 1 347 573 A1 | 9/2003 |
| FR | 1 199 095 | 12/1959 |
| GB | 834544 | 5/1960 |
| GB | 837275 | 6/1960 |
| JP | 49-005371 A | 1/1974 |
| JP | 50-155156 A | 12/1975 |
| JP | 50-155157 A | 12/1975 |
| JP | 56-32814 | 4/1981 |
| JP | 58-200622 A | 11/1983 |
| JP | 62-131616 | 6/1987 |
| JP | 2002-513227 A | 5/2002 |
| JP | 2003-8385 A | 1/2003 |
| JP | 2006-42084 A | 2/2006 |
| WO | WO 2006/032366 A1 | 3/2006 |

* cited by examiner

MULTIBAND FILTER

This application is a continuation of co-pending International Application No. PCT/EP2008/056510, filed May 27, 2008, which designated the United States and was not published in English, and which claims priority to German Application No. 10 2007 024 895.6 filed May 29, 2007, both of which applications are incorporated herein by reference.

TECHNICAL FIELD

Embodiments of the invention relate to a multiband filter having a passband for at least two mobile radio bands in which transmission and reception are possible. Furthermore, the filter has a stop band for a third wireless transmission system.

BACKGROUND

Multiband filters for a plurality of mobile radio bands having different frequency ranges require either one wide or a plurality of narrower passband ranges in order that the different frequency ranges assigned to the bands can be permitted to pass.

The patent specifications U.S. Pat. No. 5,815,052, U.S. Pat. No. 6,043,725 and U.S. Pat. No. 6,115,592 disclose multiband filters which consist of a parallel circuit comprising two bandpass filters. U.S. Pat. No. 5,184,096 discloses a wideband passband filter including a parallel circuit formed by three bandpass filters. Further multiband filters are obtained through specific design of the corresponding filter circuits.

The document EP 1 347 573 A1, also published as U.S. Pat. No. 6,927,648, discloses a multiplexer which includes high-, low- and bandpass filters and distributes input signals in four different frequency ranges correspondingly among four separate outputs.

One problem with known multiband filters is that a wide passband can be obtained only at sufficient distance from a stop band or, to put it another way, known multiband filters only have a transmission range with a flank that is flattened toward the stop band, with the result that these filters have an excessively large transition width between stop band and first passband.

SUMMARY

In one aspect, the present invention specifies a multiband filter which has at least two passbands lying above a stop band for different mobile radio bands and which, in particular, is provided with a small and therefore improved transition width between stop band and passband.

A band-stop filter is proposed which has a first and a second filter branch connected in parallel with one another. Arranged in the first filter branch is a first subfilter, which includes a bandpass filter having a first passband. Arranged in the second filter branch is a second subfilter, which includes a high-pass filter having a second passband, which is arranged above the first passband in terms of frequency. First and second filter branches are electrically connected in parallel between an input port and an output port and, for this purpose, are in each case electrically connected to a common signal input and a common signal output. Each of the two ports can include two electrical terminals, one of which can be connected to ground. Furthermore, from the first filter branch, a transverse branch is transversely connected to ground, an impedance element and, in particular, a resonator being arranged in the transverse branch. Such a construction yields a band-stop filter which has a stop band which is formed below the first passband and which undergoes transition to a first passband with a steep flank. A second passband is formed above the first passband.

The band-stop filter is constructed on a multilayered substrate having at least two structured metallization planes. In this case, bandpass filter and high-pass filter are constructed from LC-elements that are at least partly integrated in the multilayered substrate. Given suitable dimensioning of the LC-elements and given corresponding positioning of the resonant frequency of the resonator it is possible to obtain a plurality of passbands having an extremely high relative bandwidth of in each case more than 5% in conjunction with low insertion loss, the nearby stop band having a high attenuation and a small transition width with respect to the first passband. The band-stop filter that is at least partly integrated into the substrate is additionally compact and cost-effective to produce.

It is advantageous for a steep flank between the stop band and the first passband if an electroacoustic resonator having a quality factor of at least 500 is used as the impedance element. The resonator is preferably specified such that its resonant frequency approximately corresponds to the upper edge of the stop band.

A particularly wide first passband is obtained if the resonator has a high pole-zero separation. In the case of an electroacoustic resonator, the separation is all the greater, the higher the coupling of the piezoelectric material of the resonator. By way of example, lithium niobate and potassium niobate can be used as highly coupling materials for electroacoustic resonators.

However, it is also possible to increase the pole-zero separation of an electroacoustic resonator by means of an inductance connected in series therewith. In one configuration, therefore, in the transverse branch with respect to ground, the resonator is connected in series with an inductance. In this case, lithium tantalate is also suitable as piezoelectric material.

The electroacoustic resonator can be an SAW (surface acoustic wave) resonator, a BAW (bulk acoustic wave) resonator or a ceramic microwave resonator, each of which can be realized with high quality factors.

Of the LC elements from which bandpass filters and high-pass filters are constructed, at least a portion is realized cost-effectively as integrated elements in the substrate. Their quality factors are less than 50, for example. Parts of the LC elements are therefore realized as discrete elements in the form of capacitors and/or coils and, in particular, mounted on the surface of the substrate which has the integrated LC elements. It is advantageous, for example, to realize the capacitances which can be produced with relatively small manufacturing tolerances in the form of elements integrated into the substrate, but to realize at least a portion of the inductances as a discrete coil.

In one possible application of the multiband filter proposed, the stop band corresponds to the band between 470 and 750 MHz reserved for the DVB-H system (digital video broadcast-handheld), while the first and second passbands for the transmitting and receiving bands are assigned to the conventional mobile radio systems operating in the 1 and 2 GHz ranges. A band-stop filter dimensioned in this way therefore has at least a first passband between 824 and 960 MHz and a second passband between 1710 and 2170 MHz. What can be achieved with the aid of series capacitances arranged on the input and output sides of the second filter branch with the high-pass filter, and with the aid of series inductances at the input and output of the first filter branch, is that only ever one of the two filter branches transmits, while the respective other branch constitutes an open circuit.

However, it is also possible to shift the cut-off frequency of the high-pass filter (second subfilter) into the range of the first passband. This has the effect that when frequencies in the 1 GHz range are applied to the band-stop filter, both the first and the second filter branch can transmit power. However, signals in the 2 GHz range are transmitted exclusively in the second filter branch, while the first subfilter constitutes an open circuit. Through a suitable choice of the cut-off frequency of the high-pass filter, it is possible to realize a very wide transmission band which, above the first passband, has only a small dip with slightly increased attenuation and already transmits optimally again, that is to say with low insertion loss, at approximately 1300 MHz.

While the passbands are created practically exclusively by correspondingly dimensioned LC-elements of bandpass filter and high-pass filter, with the aid of the impedance element arranged into a transverse branch with respect to the first filter branch, a steep transition from the first passband to the stop band is realized, which, in one embodiment, blocks with an attenuation of at least −13 dB up to approximately 750 MHz and with an attenuation of more than −25 dB below 700 MHz.

One suitable bandpass filter in the first filter branch includes at least a first and a second series inductance, a first and a second series capacitance and, connected to ground transversely with respect thereto, a first parallel inductance. The bandpass filter can additionally include a third series inductance and optionally a second parallel inductance. First and second parallel inductances are respectively arranged in a dedicated transverse branch with respect to the second filter branch and can be connected in series with a capacitance likewise arranged in the respective transverse branch.

One suitable high-pass filter in the second filter branch can include a first and a second series capacitance and an inductance arranged between the two series capacitances in a transverse branch connected to ground. The inductance in the transverse branch of the high-pass filter can additionally be connected in series with a capacitance likewise arranged in the transverse branch.

If high power is applied to the band-stop filter, as is the case, for example, in the transmitting branch of a mobile radio system, then the resonator should have a particular power strength and be able to withstand signals of more than 30 dBm without damage, which corresponds to a power present of more than 1 watt.

The power strength of a resonator embodied, e.g., as a single-port SAW resonator can be increased by cascading. A quadrupling of the power strength is obtained, for example, by means of a double cascade of two resonators connected in series. In this case, the impedance of such a cascaded resonator can remain unchanged by comparison with the uncascaded resonator by means of corresponding quadrupling of the resonator area.

The resonator also experiences a lower application of power when it is arranged in the first filter branch in the vicinity of the signal output, or when the transverse branch with the resonator is arranged in a terminally situated fashion in the first filter branch and the band-stop filter is connected to a corresponding polarity.

If an SAW resonator is used in the transverse branch with respect to the first filter branch, then it can be embodied as a one-port resonator without reflectors. In this case, additional chip area is saved and the substrate area for the entire band-stop filter is thus reduced as well.

The band-stop filter proposed can be used, in particular, in mobile telephones having transmitting and receiving paths in the first and in the second passband. If the filter is then used in the transmitting path between antenna and transmitting amplifier, interference signals lying in the stop band, which can occur on account of noise in the transmitting amplifier, can be filtered out by means of the band-stop filter. High suppression of signals in the stop band makes it possible to operate a DVB-H receiving branch (=digital video broadcast-handheld) which is likewise realized in the mobile radio device without interference as a result of the simultaneous telephone operation in the first or second passband.

Without such a band-stop filter it would be possible for the noise in the transmitting amplifier in the range of the DVB-H frequencies to be transmitted to the second antenna required for the DVB-H system and give rise there to a reduced reception quality or interference with DVB-H reception. The band-stop filter is therefore preferably arranged in one or more transmitting branches between a power amplifier and the antenna. Between band-stop filter and antenna, branching to further transmitting and receiving branches can be performed by at least one of the elements antenna switch, duplexer or diplexer or by combination of the elements mentioned.

In one advantageous development, a bridging circuit is provided for the band-stop filter, by which bridging circuit the band-stop filter is removed from the mobile radio path, here the transmitting path, and bridged if DVB-H is not activated. The electrical losses which can possibly arise as a result of the additional filter elements of the band-stop filter can thereby be restricted to the time period in which DVB-H is activated. The bridging circuit can include an additional switch that opens or closes a bridging path.

BRIEF DESCRIPTION OF THE DRAWINGS

The band-stop filter proposed is explained in greater detail below on the basis of exemplary embodiments and the associated figures. The figures are illustrated purely schematically and not as true to scale and serve solely for elucidating the invention.

The following list of reference symbols may be used in conjunction with the drawings:
BP Bandpass filter
BS Band-stop filter
C1, C2, . . . Capacitances
FZ1, FZ2 First and second filter branches
HP High-pass filter
L1, L2, . . . Inductances
R Resonator
1-4 Transmission curves of Examples 1-4
T1, T2 Terminals
D1, D2 First and second passbands
SP Stop band
AK External contact
M Metallization plane
SU Substrate

DETAILED DESCRIPTION OF ILLUSTRATIVE EMBODIMENTS

Figure 1:
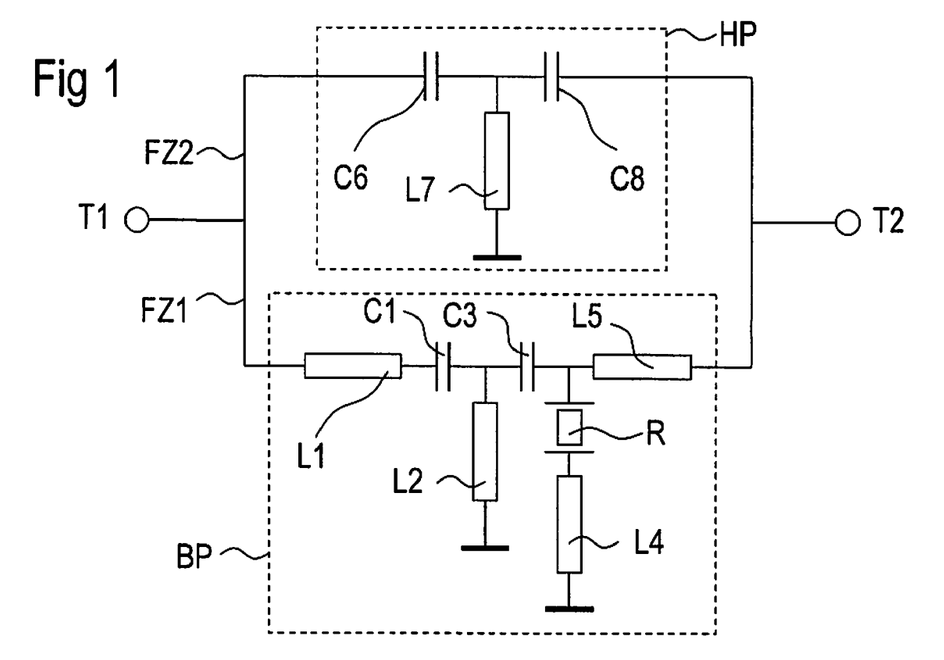
FIG. 1 shows a first exemplary embodiment of a band-stop filter.

FIG. 1 shows a first exemplary embodiment of a band-stop filter proposed. A first filter branch FZ1 and a second filter branch FZ2 are connected in parallel between a first terminal T1 and a second terminal T2. A bandpass filter BP is arranged in the first filter branch FZ1. The bandpass filter comprises, connected in series, a first inductance L1, a first capacitance C1, a third capacitance C3 and a fifth inductance L5. Between the first and third capacitances C1, C3, a second inductance L2 is arranged in a transverse branch relative to ground. Between the third capacitance C3 and the fifth inductance L5, a resonator R and, in series therewith, a fourth inductance L4 are arranged in a further transverse branch to ground. The numbering here does not mean that a corresponding number of the respective circuit element type are present. Rather, the numbering counts up over all, i.e. including different, elements or circuit points.

The two filter branches FZ1 and FZ2 are realized on a multilayered substrate. In this case, all the capacitances can be realized as integrated capacitances within the multilayered substrate in the form of metallization areas that are structured in mutually adjacent metallization planes of the substrate. Likewise, a portion of the inductances L can be realized as integrated elements in the multilayer substrate. However, at least a portion of the inductances is realized in each case as a discrete device and preferably mounted on the surface of the multilayer substrate. The resonator R is preferably an electroacoustic resonator, for example, an SAW resonator, which is arranged as a bare die likewise on the surface of the multilayer substrate by means of flip-chip technology and is electrically connected to the interconnection integrated in the substrate. The high-pass filter HP realized in the second filter branch comprises a sixth capacitance C6 and an eighth capacitance C8, between which a seventh inductance L7 is arranged in a transverse branch to ground.

Figure 2:
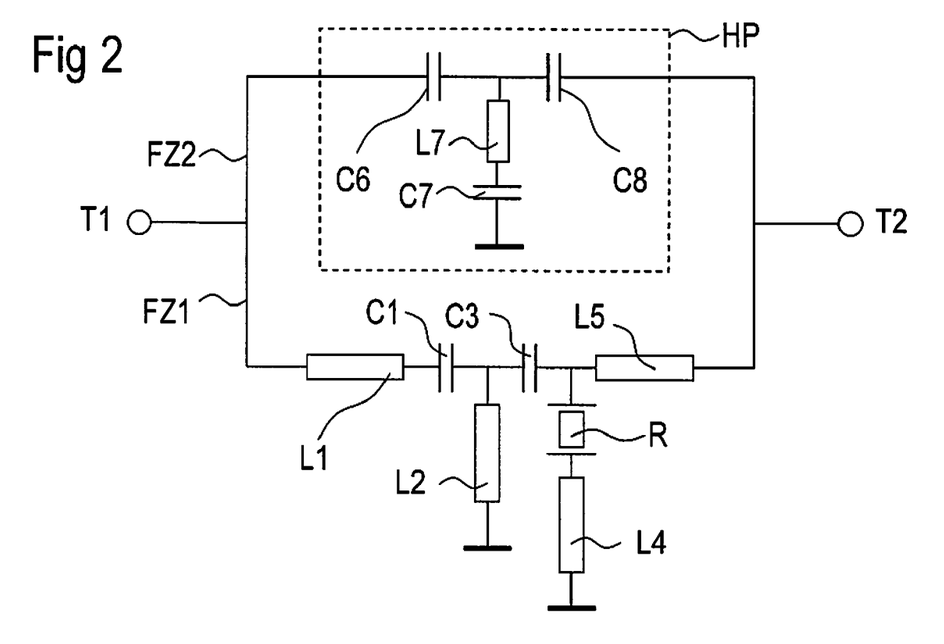
FIG. 2 shows a second exemplary embodiment.

FIG. 2 shows a further exemplary embodiment of a band-stop filter proposed, wherein, in contrast to the first exemplary embodiment, within the high-pass filter HP in the transverse branch and in series with the seventh inductance L7, a seventh capacitance C7 is connected to ground. On account of the additional circuit element ($7^{th}$ capacitance), the discrete values of the remaining circuit elements are optimized anew. This has the effect that not only the circuit elements of the high-pass filter HP but also those of the circuit elements within the bandpass filter can assume further discrete values. What can be achieved in this way is that each of the two filters is adapted with the aid of correspondingly dimensioned circuit elements of the second filter, and vice versa. On account of this fact alone, in the case of the discrete values of the circuit elements, relatively large differences can also arise with respect to the values which can be chosen in the first exemplary embodiment for the bandpass filter that is identical there in terms of the equivalent circuit diagram.

Figure 3:
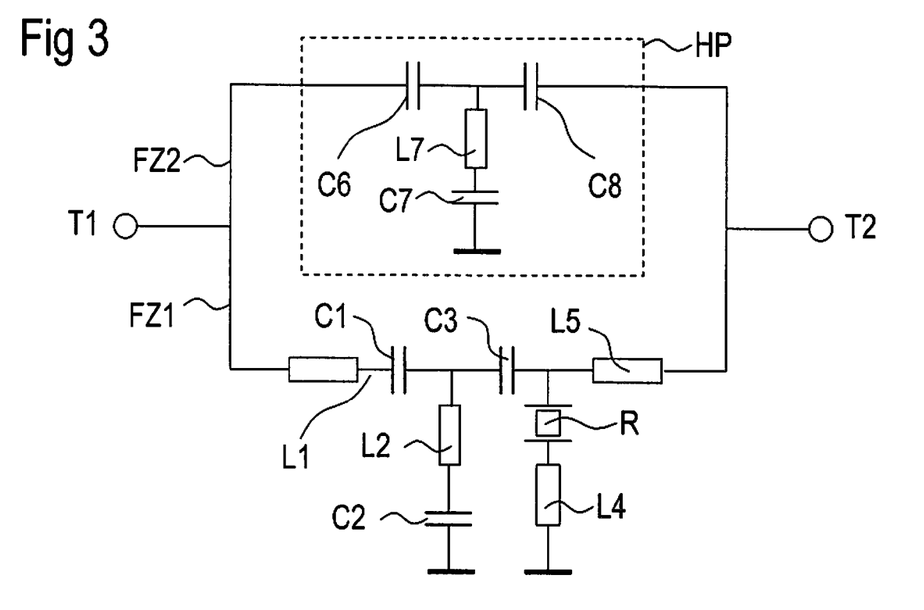
FIG. 3 shows a third exemplary embodiment.

FIG. 3 shows a further (third) exemplary embodiment of a band-stop filter, which, proceeding from the second exemplary embodiment, has a further capacitance, which is connected in the corresponding transverse branch to ground as a second capacitance C2 in series with the second inductance L2. The high-pass filter HP remains unchanged with respect to the second exemplary embodiment with regard to the circuit arrangement, as does the arrangement of the circuit elements of the bandpass filter with respect to the second exemplary embodiment, but not their discrete values.

Figure 4:
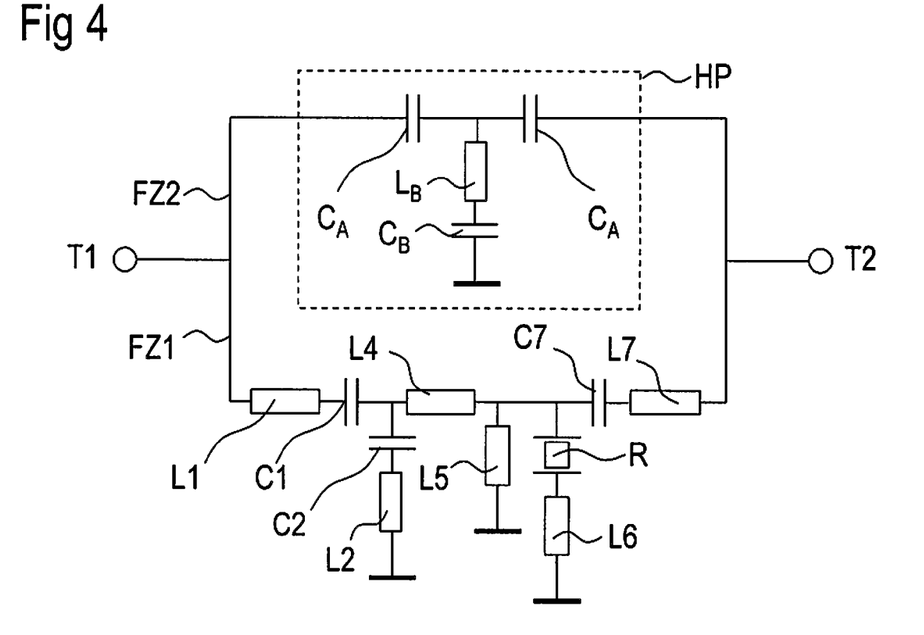
FIG. 4 shows a fourth exemplary embodiment.

FIG. 4 shows a fourth exemplary embodiment of a band-stop filter, wherein the arrangement of the circuit elements remains unchanged in the high-pass filter HP with respect to the third exemplary embodiment. By contrast, the bandpass filter now includes, in the first filter branch FZ1, connected in series, a first inductance L1, a first capacitance C1, a fourth inductance L4, a seventh capacitance C7 and a seventh inductance L7. In a transverse branch relative to ground, a second capacitance C2 and a second inductance L2 are connected in series between the first capacitance C1 and the fourth inductance L4. A first transverse branch relative to ground between the fourth inductance L4 and the seventh capacitance C7 includes a fifth inductance L5 arranged there. In a third transverse branch to ground, directly adjacent to the second transverse branch, a resonator R and a sixth inductance L6 are arranged in series. In this case, too, it holds true that, in the case of an optimization of the band-stop filter, not only are the discrete values of the transverse circuit elements altered, which are different with respect to the other exemplary embodiments, but all the components of a filter just like the circuit elements of the second filter are adapted or optimized anew.

Figure 5:
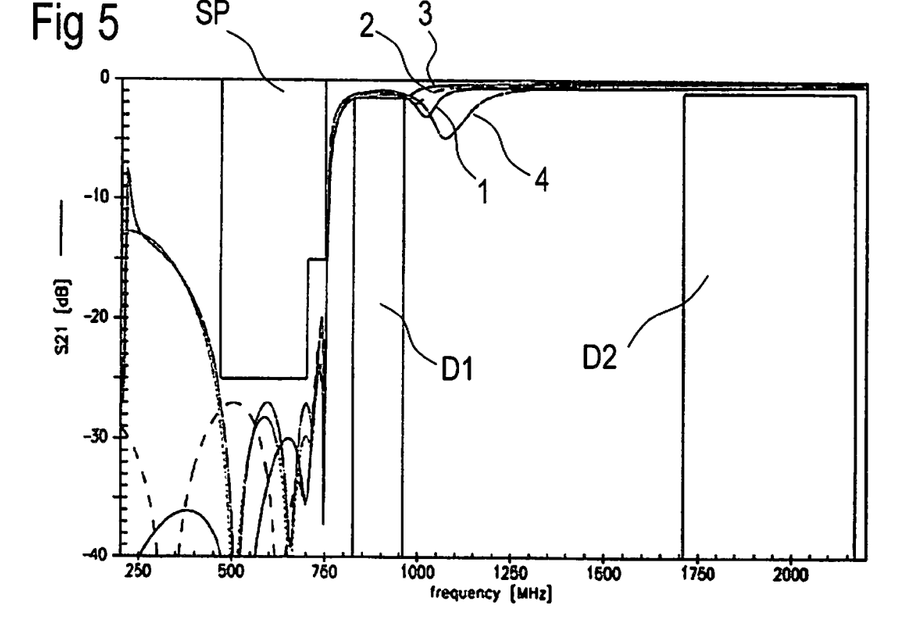
FIG. 5 shows the transmission behavior of the band-stop filters illustrated in FIGS. 1 to 4.

FIG. 5 shows the simulated transfer functions of the four exemplary embodiments in the form of their scattering parameters S21. The diagram depicts the stop band SP, the first passband D1 and the second passband D2, which are chosen here such that the stop band SP coincides with the frequency range of the DVB-H system, while D1 includes all frequencies of the 1 GHz mobile radio bands and D2 includes all frequencies of the 2 GHz mobile radio bands. It is evident that all transmission curves 1 to 4 of exemplary embodiments 1 to 4 meet the specifications for this intended application. A slight dip in the transfer function between first passband D1 and second passband D2 is harmless for the desired application since no mobile radio bands are present there.

By means of suitable dimensioning of the circuit elements L and C and also by means of a suitable resonant frequency of the resonator R, it is also possible, however, for the specifications of the band-stop filter and, in particular, stop bands SP and also first and second passbands D1, D2 to be individually optimized with regard to a different problem.

Figure 6:
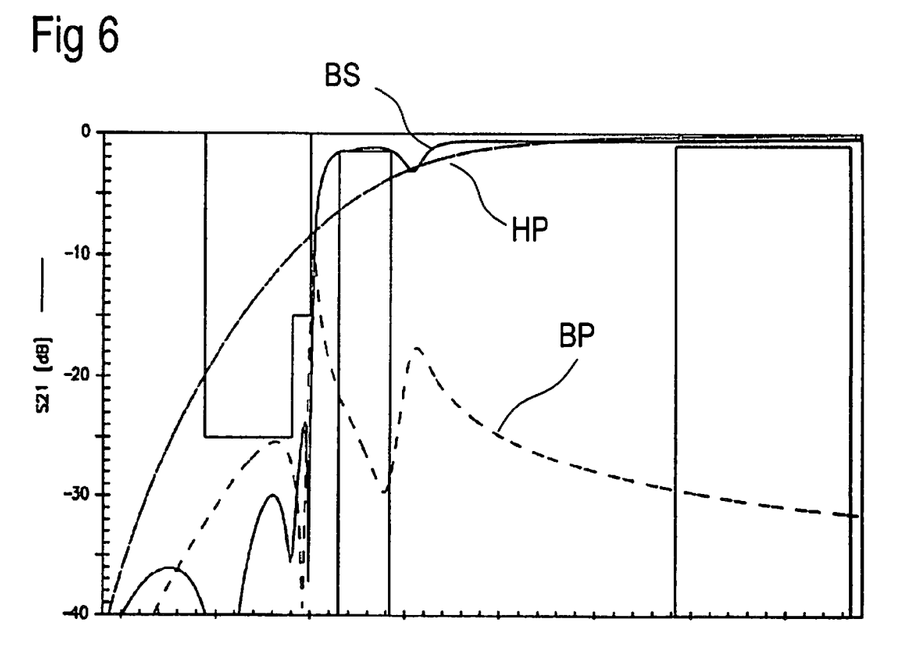
FIG. 6 shows the transmission behavior of the first and second filter branches considered in isolation.

FIG. 6 once again shows the transfer function BS of the band-stop filter according to the first exemplary embodiment, which is compared in a simulation with the partial transfer functions of high-pass filter HP and bandpass filter BP considered in isolation. It is evident from the partial transfer functions that the high-pass filter HP transmits with minimal insertion loss in the second passband D2. However, a large amount of energy can still be transmitted in the first passband D1 as well, since the cut-off frequency of the high-pass filter HP lies at the upper edge of the first passband D1. The cut-off frequency is the frequency at which the corresponding high-pass filter HP has 3 dB attenuation relative to the point having the lowest insertion loss within the second passband D2. The isolated bandpass filter BP exhibits a great mismatch. The partial transfer function essentially generates the left-hand flank of the overall transfer function toward the stop band. The transmission curve BS illustrated in FIG. 6 is nevertheless obtained for the band-stop filter as a result of these two filters (bandpass filter, high-pass filter) being connected in parallel. This shows that the two filter branches are mutually matched to one another and external matching elements are therefore no longer required.

Figure 7:
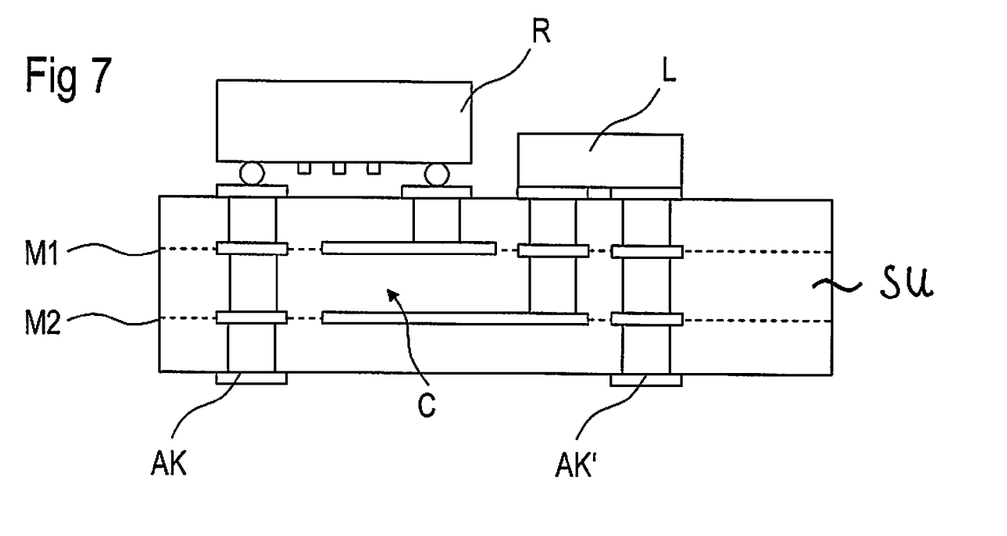
FIG. 7 shows, in schematic cross section, a band-stop filter realized on a multilayered substrate.

FIG. 7 shows, as an excerpt and in schematic cross section, one possible realization of circuit components for the band-stop filter proposed. This filter is constructed here on a multilayered substrate SU, which has two internal metallization planes M1 and M2 in the embodiment illustrated. The substrate SU is preferably composed of ceramic, and, in particular, of LTCC ceramic (low temperature cofired ceramics). However, multilayer substrates composed of other ceramics or composed of a dielectric plastic printed circuit board material that is filled, if appropriate, are also possible. Arranged in the metallization planes M1, M2 are conductor tracks and metalized areas, which can be connected to one another via plated-through holes.

On the surface of the substrate SU, as a discrete component in any event a resonator R, e.g., as here of flip-chip design is connected with the aid of bondable contacts arranged on the surface of the substrate. The resonator is illustrated here as an SAW resonator. However, it is also possible for the resonator to be embodied as a BAW or microwave ceramic resonator.

As a further discrete circuit component, here an inductance L is likewise arranged on the surface of the substrate SU and electrically connected as an SMD device (=surface mounted device) to the circuit within the substrate. A capacitance C is realized, for example, by two metallization areas arranged in mutually adjacent metallization planes M1, M2, as illustrated in FIG. 7. Further inductances can be realized in the form of inductance-exhibiting metallizations and plated-through holes. Particularly high inductance values can be implemented by relatively long conductor tracks and, in particular, by, e.g., meandering conductor tracks having a suitable electrical length embodied proportionally to the inductance, or as spirals or coils realized over a plurality of metallization planes. Preferably, the substrate SU and the band-stop filter circuit realized therein and thereon is contact connected by means of external contacts AK, AK' arranged on the underside of the substrate.

Concrete values as to how the circuit elements of the first exemplary embodiment can be dimensioned in accordance with an optimization in order to obtain the desired transmission behavior of the band-stop filter are specified below. In this case, the inductance values are specified in nH, and the capacitance values in pF:

$L1 = 28.62$ $C1 = 1.65$ $L2 = 0.80$ $C3 = 12.42$ $L4 = 6.21$ $L5 = 7.34$ $C6 = 3.05$ $L7 = 4.12$ $C8 = 3.12$.

For the first exemplary embodiment, the resonant frequency of the resonator R is chosen such that it is located in the region of the upper flank of the stop band SP. This takes account of the fact that the fourth inductance L4 connected in series with the resonator R shifts the resonant frequency toward lower frequencies. Without this inductance, it would be necessary to choose a correspondingly lower resonant frequency of the resonator.

In the example, a lithium tantalate SAW resonator having a resonant frequency of 773 MHz, an antiresonant frequency of 801 MHz and a static capacitance of 4.44 pF is used. In a corresponding manner, the discrete values for the circuit elements of the exemplary embodiments illustrated in FIGS. 2 to 4 can be determined by means of suitable optimization methods. However, the simulation results illustrated prove that the band-stop filters presented have the desired properties. Specifically, these are the large width of the entire passband, in which the band-stop filter has a low attenuation. The entire passband is suitable for accommodating a plurality of different mobile radio bands or other wireless applications. Furthermore, the band-stop filters presented exhibit a steep flank toward a stop band, wherein a transition bandwidth of approximately 10% relative bandwidth can be achieved. The stop band in turn is likewise distinguished by a large width. The relative bandwidth of the stop band in accordance with the specifications of the DVB-H system is, for example, approximately 55% relative bandwidth, in relation to the center frequency at 510 MHz. Consequently, a band-stop filter is specified which obtains hitherto unachieved properties through the novel combination of bandpass filter and high-pass filter, which is at least partly realized in the form of integrated LC elements.

The invention is not restricted to the individual circuits illustrated in the exemplary embodiments. It is clear that the individual filters can be varied by addition and omission of individual circuit components. In principle, further LC circuits are known for bandpass and high-pass filters and can be used in the band-stop filter proposed. Different combinations of known and newly designed bandpass and high-pass filters are also possible in this case.

What is claimed is:

1. A wireless communication device comprising:
a radio system that operates in a first passband and a second passband, the second passband being established above the first passband, wherein a stop band is formed below the first passband;
transmitting and receiving paths of the radio system, wherein the radio system is designed to receive a further signal in the stop band in order to filter out interference noise that is generated in the transmitting path and lies in the stop band between a transmitting path and an antenna; and
a filter circuit coupled to the radio system, the filter circuit comprising:
a multilayered substrate having integrated structured metallization planes;
an input port and an output port;
first and second filter branches coupled in parallel between the input port and the output port;
a first subfilter arranged in the first filter branch, the first subfilter comprising a bandpass filter for the first passband;
a second subfilter arranged in the second filter branch, the second subfilter comprising a high-pass filter having the second passband, wherein the bandpass filter and the high pass filter are constructed from inductor and capacitor elements that are at least partly integrated in the multilayered substrate, wherein the high-pass filter has a cut-off frequency that is chosen to be in the range of the first passband;
a transverse branch connected to ground in the first filter branch; and
an electroacoustic resonator arranged in the transverse branch, wherein the resonator has a quality factor of at least 500.

2. A band-stop filter comprising:
a multilayered substrate having integrated structured metallization planes;
an input port and an output port;
first and second filter branches coupled in parallel between the input port and the output port;
a first subfilter arranged in the first filter branch, the first subfilter comprising a bandpass filter for a first passband;
a second subfilter arranged in the second filter branch, the second subfilter comprising a high-pass filter having a second passband, the second passband being established above the first passband, wherein the bandpass filter and the high pass filter are constructed from inductor and capacitor elements that are at least partly integrated in the multilayered substrate, wherein the high-pass filter has a cut-off frequency that is chosen to be in the range of the first passband;

a transverse branch connected to ground in the first filter branch; and an electroacoustic resonator arranged in the transverse branch, wherein the resonator has a quality factor of at least 500.

3. The band-stop filter as claimed in claim 2, wherein the resonator arranged in the transverse branch is connected in series with an inductance.

4. The band-stop filter as claimed in claim 2,
wherein all the capacitor elements of the bandpass filter and the high-pass filter are integrated into the multilayered substrate; and
wherein the inductor elements are at least partly realized from discrete inductances or coils arranged on the substrate.

5. The band-stop filter as claimed in claim 2, wherein a stop band is formed below the first passband and wherein the resonator has a resonant frequency that lies in a region of an upper flank of the stop band.

6. The band-stop filter as claimed in claim 2, wherein a series capacitance in the second filter branch is arranged on input and output sides of the second filter branch.

7. The band-stop filter as claimed in claim 2, wherein the bandpass filter, in the first filter branch, comprises at least a first and a second series inductance, a first and a second series capacitance and, a first parallel inductance connected to ground transversely with respect thereto.

8. The band-stop filter as claimed in claim 7, wherein the bandpass filter further comprises a third series inductance and a second parallel inductance.

9. The band-stop filter as claimed in claim 8, wherein the first or second parallel inductance is arranged in a transverse branch with respect to the first filter branch and is connected in series with a capacitance.

10. The band-stop filter as claimed in claim 2, wherein the high-pass filter, in the second filter branch, comprises at least a first and a second series capacitance and an inductance arranged in a transverse branch connected therebetween relative to ground.

11. The band-stop filter as claimed in claim 10, wherein the inductance in the transverse branch of the high-pass filter is connected in series with a capacitance.

12. The band-stop filter as claimed in claim 2, wherein a stop band is formed below the first passband and wherein the stop band is between at least 470 and 750 MHz;
the first passband is between at least 824 and 960 MHz; and
the second passband is between at least 1710 and 2170 MHz.

13. The band-stop filter as claimed in claim 2, wherein the resonator is embodied as an at least doubly cascaded SAW resonator and is arranged on the multilayered substrate.

14. The band-stop filter as claimed in claim 2, wherein the resonator is embodied as a SAW resonator in a chip composed of a substrate material.

15. The band-stop filter as claimed in claim 14, wherein the substrate material has a higher piezoelectric coupling coefficient than lithium tantalate.

16. A wireless communication device comprising:
an antenna;
a transmitting path coupled to the antenna;
a receiving path coupled to the antenna, the transmitting and receiving paths operating in the 1 and 2 gigahertz ranges; and
a band-stop filter comprising:
a multilayered substrate having integrated structured metallization planes;
an input port and an output port;
first and second filter branches coupled in parallel between the input port and the output port;
a first subfilter arranged in the first filter branch, the first subfilter comprising a bandpass filter for a first passband in the 1 gigahertz range;
a second subfilter arranged in the second filter branch, the second subfilter comprising a high-pass filter having a second passband in the 2 gigahertz range, the second passband being established above the first passband, wherein the bandpass filter and the high-pass filter are constructed from inductor and capacitor elements that are at least partly integrated in the multilayered substrate;
a transverse branch connected to ground in the first filter branch; and
a resonator arranged in the transverse branch;
wherein the wireless communication device is designed to receive DVB-H signals for filtering out interference signals lying in a DVB-H frequency range from the transmitting path.

17. The wireless communication device as claimed in claim 16, wherein the wireless communication device is designed to bridge the band-stop filter if a DVB-H mode is not activated in the wireless communication device.

* * * * *